(12) United States Patent
Webb

(10) Patent No.: US 6,582,567 B1
(45) Date of Patent: Jun. 24, 2003

(54) METHOD OF GROWING EPITAXIAL LAYERS USING MAGNETRON SPUTTER SOURCE IN MBE APPARATUS

(75) Inventor: James Webb, Manotick (CA)

(73) Assignee: National Research Council of Canada, Ottawa (CA)

(*) Notice: Subject to any disclaimer, the term of this patent is extended or adjusted under 35 U.S.C. 154(b) by 0 days.

(21) Appl. No.: 09/717,221

(22) Filed: Nov. 22, 2000

(51) Int. Cl.$^7$ ................................................ C23C 14/34
(52) U.S. Cl. .................................... 204/192.15; 438/913
(58) Field of Search ..................... 204/298.16, 298.17, 204/298.19, 192.1, 192.11, 192.12, 192.15; 438/479, 796, 913

(56) References Cited

U.S. PATENT DOCUMENTS

| | | | | |
|---|---|---|---|---|
| 4,517,070 A | * | 5/1985 | Kisner .................... | 204/298.19 |
| 4,999,096 A | * | 3/1991 | Nihei et al. ............ | 204/192.15 |
| 6,132,565 A | * | 10/2000 | Lin ........................ | 204/192.12 |
| 6,156,172 A | * | 12/2000 | Kadokura .............. | 204/298.26 |
| 6,254,747 B1 | * | 7/2001 | Hoshino et al. ....... | 204/298.11 |

OTHER PUBLICATIONS

H. Tang et al. "Growth of high mobility GaN by ammonia–molecular beam epitaxy", Apr. 19, 1999, Aplied Physics Letters, vol. 74, No. 16, pp 2373–2374.*

H. Tang et al. "Influence of crystalline defects on transport properties of GaN grown by ammonia–molecular beam epitaxy and magnetron sputter epitaxy", Mar. 2000, Journal of Electronic Materials, vol. 29, Issue 3, pp 268–273.*

P. Singh et al. "Growth and characterization of GaN thin films by magnetron sputter epitaxy" Mar./Apr. 1998, J. Vac. Sci. Technol. A 16(2), pp 786–789.*

P. Sutter et al. "Magnetron Sputter epitaxy of Si/Ge heterostructures" 1995, Journal of Crystal Growth 157, pp 172–176.*

Abstract of CA 2284475 A1 Apr. 4, 2001.*

* cited by examiner

Primary Examiner—Patrick Ryan
Assistant Examiner—Gregg Cantelmo
(74) Attorney, Agent, or Firm—Marks & Clerk

(57) ABSTRACT

A magnetron sputter source is adapted to fit into a K-cell port in a molecular beam epitaxy apparatus. The MSE source has a protruding cylindrical body for insertion into the K-cell port. The cylindrical body is attached at its proximal end to a flange and has its distal end open. An array of permanent magnets is arranged at the distal end of the cylindrical body. A magnet return piece is mounted behind the permanent magnets. A sputter target is mounted in front of the permanent magnets, and cooling ducts within the cylindrical body carry a cooling medium to the sputter target.

12 Claims, 3 Drawing Sheets

METHOD OF GROWING EPITAXIAL LAYERS USING MAGNETRON SPUTTER SOURCE IN MBE APPARATUS

FIELD OF THE INVENTION

This invention relates to a method of growing epitaxial layers using a magnetron sputter source in molecular beam epitaxy apparatus.

BACKGROUND OF THE INVENTION

Magnetron sputter epitaxy has become increasingly popular as a technique for depositing thin layers. For example, in recent years there has been tremendous interest in GaN based III-N materials. A dramatic improvement in the material quality has led to the development of high brightness light emitting diodes, and more recently "blue" laser diodes. There has also been a dramatic improvement in the performance of high power microwave metal-semiconductor field-effect transistors and modulation doped field-effect transistors based on these materials.

Crucial to all these applications is the growth of material with high crystalline quality and of high purity. Magnetron sputter epitaxy (MSE) is a technique that has been used to grow GaN. Typically GaN epilayers are grown on sapphire substrates, which are highly lattice mismatched, necessitating the predeposition of a thin (~500 Å) buffer/nucleation layer of either GaN or AlN. The observed electrical and optical properties of the resulting GaN layers is strongly dependent on the dislocation density and of the overall impurity content.

Prior art magnetron sputter sources require special MBE machines. An object of the invention is provide an MSE source that will fit onto a standard MBE machine.

SUMMARY OF THE INVENTION

According to the present invention there is provided a method wherein a magnetron sputter source is adapted to fit into a K-cell port in a molecular beam epitaxy apparatus, the magnetron sputter source comprising a protruding cylindrical body for insertion into the K-cell port, said cylindrical body being attached at its proximal end to a flange and having its distal end open; an array of permanent magnets arranged at the distal end of said cylindrical body; a magnet return piece mounted behind said permanent magnets; a sputter target mounted in front of said permanent magnets; and cooling ducts within said cylindrical body for carrying a cooling medium to said sputter target.

The magnetron sputter source can be used for depositing gallium nitride or like epilayers as disclosed in U.S. Pat. No. 6,291,318. Using this method, silicon doped GaN epilayers having room temperature electron mobilities >550 cm$^2$/V s can be grown on (0001) sapphire. Unlike other growth techniques, the initial buffer/nucleation layer, preferably of AlN (aluminum nitride), is grown by MSE. The magnetron sputter source in accordance with the invention can also be used for other applications.

The magnetron sputter source can be used in a dual mode MBE/MSE system. The MSE technique differs from conventional MBE in that an ultrahigh vacuum dc magnetron sputter cathode is used as the group III source and deposition of the layers occurs in the pressure range of 1–5 mTorr.

Typically, the MSE technique is employed only for the growth of a buffer/nucleation layer. The GaN layer is deposited by ammonia MBE where a conventional dual filament K cell is used for the gallium source, and high purity ammonia is used as the source of nitrogen.

Preferably, the deposition system is equipped with a substrate holder capable of heating the 2 in. sapphire(0001) wafers to temperatures in excess of 1000° C. Typical growth temperatures for the GaN layers were in the range of 860–920° C. as measured by an optical pyrometer (emissivity set to 0.3).

BRIEF DESCRIPTION OF THE DRAWINGS

The invention will now be described in more detail, by way of example only, with reference to the accompanying drawings, in which;

FIG. 4b is a perspective detail of the end of the MSE device shown in FIG. 4a.

DESCRIPTION OF THE PREFERRED EMBODIMENTS

Figure 1:
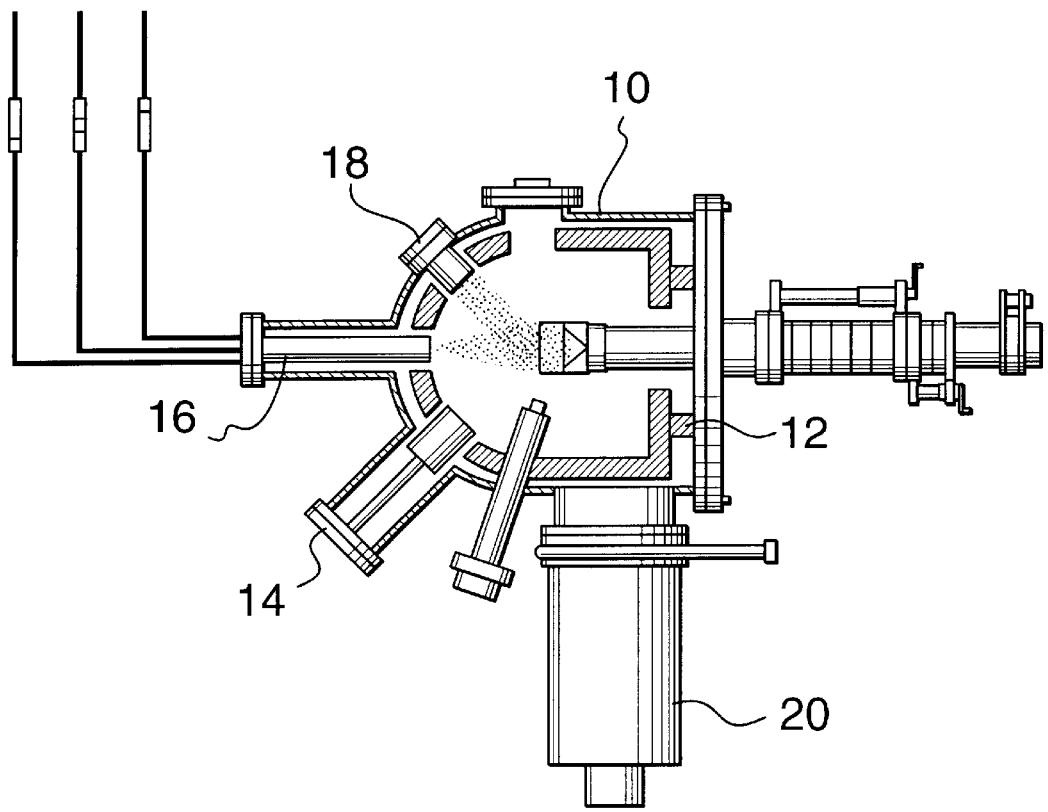
FIG. 1 is a schematic diagram of an MSE system.

The dual MBE (molecular beam epitaxy)/MSE system shown in FIG. 1 comprises a vacuum chamber 10 with a nitrogen cryoshroud 12, and port(s) 14 for K-cells, port 16 for a 3-source alkyl/gas injection cell, and port(s) 18 for modified-UHV magnetron sputter sources, such as aluminum. Cryopump 20 is connected to the chamber 10.

The main chamber 10 is cryo/turbopumped to a base pressure of <5×10$^{-11}$ torr. Substrates up to 4" diameter are introduced into the main chamber via a load-lock and transfer arm. A BN coated graphite heater is used to heat substrates up to 1200° C. Substrates are typically 2" (0001) sapphire coated on the back surface with molybdenum. Smaller pieces are mounted using indium solder to a 2" silicon wafer.

With this system, a solid MBE-grade aluminum source can be D.C. sputtered using an argon plasma operating at 1–3 mtorr [target power of 50 Watts, 400 Volts]. High purity ammonia introduced via the gas injection cell is used as the nitrogen source [flow of 15 sccm]. The magnetron plasma is sufficient to provide a source of nitrogen ions for the growth of AlN. Growth rates for the MSE grown AlN buffer layer at 880° are typically 0.15 to 0.25 μm/hr.

EXAMPLE

Sapphire wafers (backside sputter coated with Mo) were degreased in chloroform vapor followed by a 1 min dip in 10% HF, then rinsed in deionized water and blown dry with nitrogen gas. The substrate was then introduced into the system load-lock where degassing of the wafer was carried out before introduction into the growth chamber 10. The growth chamber was fully cryoshrouded with a base pressure of <10-9 Torr. The substrate was then heated to a temperature of 1000° C. under 130 sccm of ammonia for 10 min before cooling to the buffer layer growth temperature of 880° C.

The buffer or nucleation layer of AlN was used. This layer was deposited by MSE using a high purity Al magnetron sputter cathode and ammonia. The growth of the nucleation and epilayer was monitored using in situ laser reflectance spectrometry. A 200 A nucleation layer was deposited at a growth rate of 34 A/min with argon and ammonia flows of 40 and 15 sccm, respectively. This resulted in a deposition pressure of about 1.4 mTorr.

Following the deposition of the AlN nucleation layer, the substrate was then heated to the GaN epilayer growth temperature. The Ga K-cell temperature was adjusted to give a growth rate of from 1–2 $\mu$m/h at an ammonia flow rate of 50 sccm. Typical base pressures of $3-10^{-6}$ Torr were observed during growth. Both undoped and silicon doped layers were grown. For the doped layers, silane was used as the dopant source. The formed GaN layers had thicknesses of ~2 $\mu$m.

The epilayers were characterized using a triple axis x-ray diffractometer $\omega$ and $\omega$-2$\theta$ scans were carried out to determine both the mosaicity and crystalline quality of the deposited layers. Hall effect mobilities and carrier densities were measured using a van der Pauw geometry (sample size of ~0.5×0.5 cm, applied field of 3 kG) with soldered indium dots as the ohmic contacts. The contacts were verified to be ohmic by I–V measurements. Photoluminescence (PL) was performed at room temperature (RT) and 4 K using excitation from a He—Cd laser with an incident power density of <0.25 W/cm2.

Table 1 gives the observed x-ray linewidths and electrical data for a number of layers grown at several different temperatures. All data shown in Table I are for layers that were intentionally doped to $1-7 \times 10^{17}$ cm$^3$. As shown in Table 1, the minimum linewidths for the $\omega$ and $\omega$-2$\theta$ scans were 210 and 13.7 arcsec, respectively, with the highest observed mobility of 560 cm$^2$/V s for a carrier density of $1.44 \times 10^{17}$ cm$^{-3}$.

TABLE 1

| Layer No. | X-ray $\omega$ scan (arcsec) | X-ray $\omega$ 2$\theta$ scan (arcsec) | Carrier density n ($\times 10^{17}$ cm$^{-3}$) | Electron mobility $\mu$(cm$^2$/Vs) |
|---|---|---|---|---|
| 1 | 210 | 13.7 | X.5 | 356 |
| 2 | 271 | 17.0 | 7.0 | 400 |
| 3 | 299 | 14.8 | 7.0 | 340 |
| 4 | 377 | 15.8 | 3.5 | 407 |
| 5 | 303 | 14.2 | 1.4 | 560 |
| 6 | 324 | 14.5 | 1.6 | 547 |
| 7 | 323 | 14.9 | 1.3 | 544 |

Figure 2:
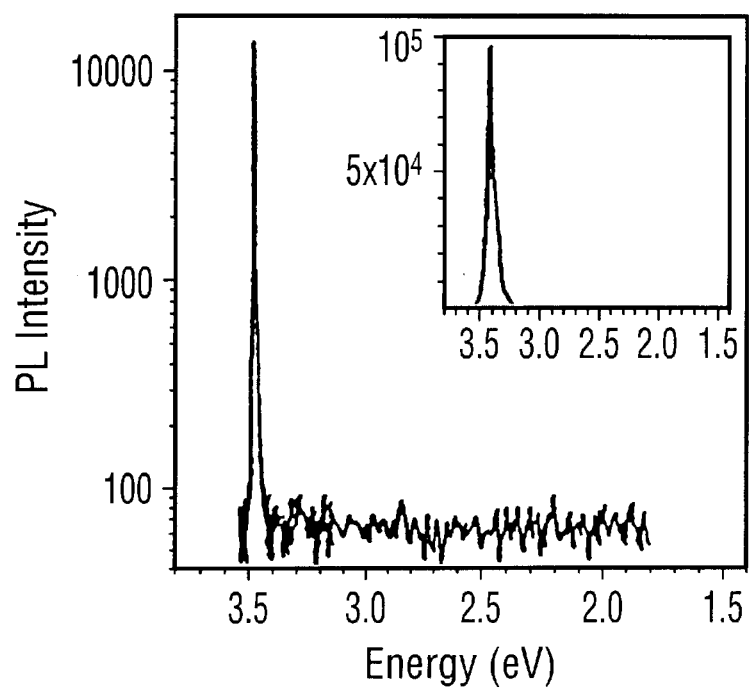
FIG. 2 is a plot showing photoluminescent intensity against energy for a 2.2 thick GaN epilayer on (0001) sapphire at 4K and room temperature.

FIG. 2 gives a plot of the observed PL spectrum for a representative layer of GaN. As shown in FIG. 2, even at very low excitation intensities the yellow luminescence band is very weak at room temperature and virtually absent at 4° K. The spectra are dominated by strong donor-bound exciton emissions at 3.48 and 3.42 eV with FWHM of 4.9 and 47 meV for temperatures of 4 K and room temperature, respectively. At 4 K only very weak emission from donor-acceptor transitions are observed, which would indicate a low density of defects and/or impurities. This is consistent with the observed high mobilities and correspondingly low compensation for these layers.

Figure 3:
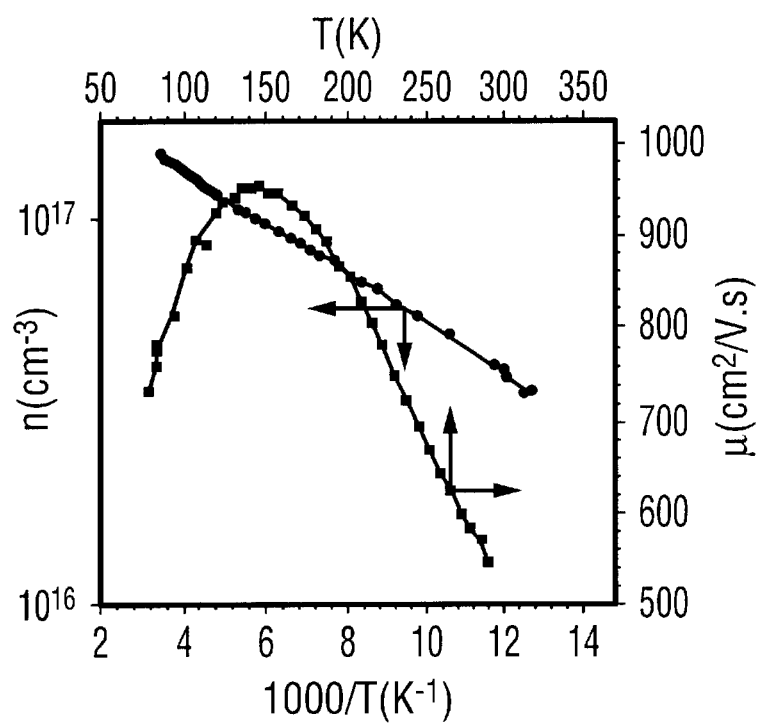
FIG. 3 shows the Hall effect carrier mobility and carrier density for a 2.3 μm thick GaN epilayer on (0001) sapphire for temperatures in the range 77 to 300° K.

FIG. 3 shows the measured mobility and carrier density of a representative layer. As shown in FIG. 3, a peak mobility of 952 cm2/V s is observed at a temperature of 145 K. The corresponding carrier density shows a single activation energy of about 13 meV, which is similar to that observed previously for silicon doped GaN.

By the described technique, MBE, GaN layers with electron mobilities of up to 560 cm2/V s can be successfully grown with good reproducibility. This indicates that using the MBE technique with an MSE grown AlN buffer layer, the type of defects affecting the electron mobility can be reduced significantly as they have been using MOVPE but without the attendant disadvantages of MOVPE.

The magnetron sputter epitaxy source assembly in accordance with the principles of the invention will now be described in more detail with reference to FIGS. 4a and 4b.

As will be appreciated by one skilled in the art, in molecular beam epitaxy systems, such as illustrated in FIG. 1, K-cells are typically used as the MBE source. K-cells are effusion cells where the material to be deposited is heated in a crucible to the vaporization temperature. The problem with K-cells is that the flux is controlled by the temperature of the crucible. Since the vapor pressure is exponentially dependent on temperature, control of the flux is difficult. By contrast, a magnetron sputter source provides a highly stable flux, which is easily controlled.

It is desirable simply to be able to replace a K-cell with an MSE sputter cell in order to perform the initial magnetron sputter epitaxy. The design shown in FIGS. 4a and 4b is compatible with an existing K-cell. Furthermore, it uses the conventional DC power supply of conventional magnetron sources. The design is UHV (Ultra High Vacuum) compatible and serves as a direct replacement for existing K-cells.

Figure 4A:
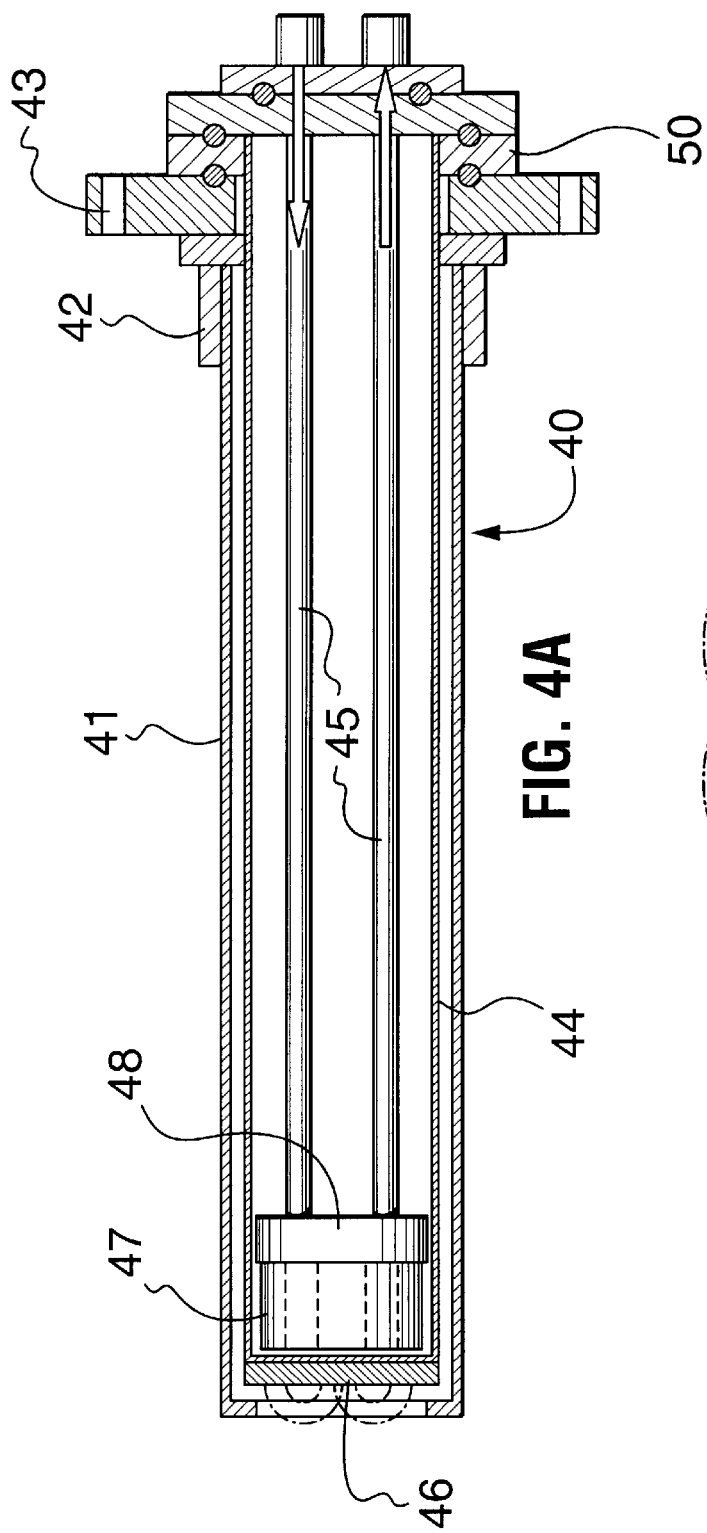
FIG. 4a is a schematic sectional view of a magnetron sputter source for molecular beam epitaxy.
Figure 4B:
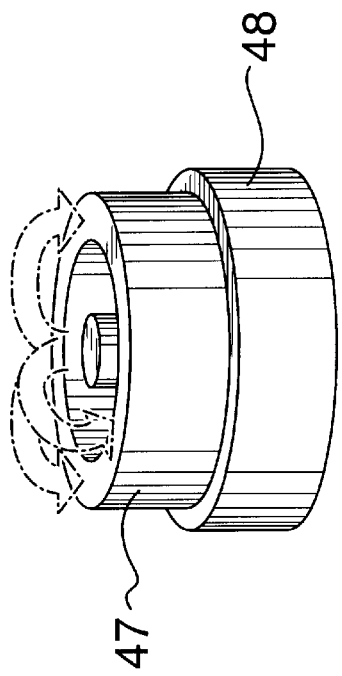

As shown in FIGS. 4a and 4b, the MSE sputter source comprises a gun assembly 40 with a cylindrical anode shield 41 protruding from an annular support 42 attached to a flange 43.

Within the anode shield 41 is mounted a cylindrical cathode body 44 containing feed and return pipes for cooling water.

A target 46, for example of aluminum, is mounted on the end of the gun assembly 44. Behind the target 46 are located permanent magnets 47 and magnet return piece 48. The magnets are configured so that the magnetic field lines radiate angularly from the center, extending through the target surface. The magnets are typically high field ceramic magnets with sufficient field strength for use with targets having thicknesses in the range of 0.125 to 0.25 inches. Typically, the magnets could be high field samarium cobalt magnets, such as might, for example, be obtained from Jean-Ell Enterprise Co. Ltd., No. 61, Sec. 1, Chung Cheng Road, Shih-Lin, Taipei, Taiwan, R.O.C. All components are UHV compatible. Metal UHV seals are used in the device. The length of the assembly is designed to fit commercially produced K-cell ports. The flange 43 is similar to a flange on a typical K-cell so that the assembly can be inserted as a replacement for a conventional K-cell.

The targets 46 are water-cooled with the water flowing through the cooling ducts 45. The cooling water is isolated from the vacuum system. The magnets and cooling lines are removable to permit bake-out at the source. To remove the magnets and cooling plates, retaining screws that hold the plate 48 to the gun assembly 44 are first removed. The plate 48 is sealed using a standard Viton "O" ring seal. This is a water seal only, which is not exposed to a vacuum.

The gun assembly 44 is sealed via metal "C" ring seals to the ceramic insulator 50 and then to the UHV flange 43 which connects to the main chamber. The arrangement forms a UHV seal. As a result, when the magnet assembly is removed, the gun can be baked out since no magnets or cooling liquid is present.

The device is designed for DC operation. Typical operation occurs at Argon pressures down to 1.8 mTorr. Typical cathode voltage is 394 volts for powers of 10 to 50 watts. The target 46 can of course be made of materials other than aluminum.

The device operates in a manner similar to a conventional magnetron source, but the novel design permits it to be substituted for a K-cell in a conventional molecular beam epitaxy apparatus.

I claim:

1. A method of growing epitaxial layers in a multilayered structure, comprising the steps of:
   a) providing a dual mode molecular beam epitaxy/ magnetic sputter epitaxy apparatus comprising
      (i) a vacuum chamber having a K-cell port for normally receiving a K-cell in an MBE (molecular beam epitaxy) mode, and
      (ii) a nitrogen source for supplying nitrogen to said vacuum chamber;
   b) growing a first epitaxial layer on a substrate in said vacuum chamber by magnetron sputter epitaxy using a removable MSE (magnetron sputter epitaxy) source assembly replacing said K-cell in said K-cell port and comprising
      (i) a protruding cylindrical body forming an anode shield and attached at its proximal end to a flange forming an ultra high vacuum seal and having its distal end open,
      (ii) an array of permanent magnets at the distal end of said cylindrical body,
      (iii) a magnet return piece mounted behind said permanent magnets,
      (iv) a sputter target mounted in front of said permanent magnets, said permanent magnets being configured that the magnetic field lines radiate through the target surface, and
      (v) cooling ducts within said cylindrical body for carrying a cooling medium to said sputter target, and
   c) growing a second epitaxial layer over said first epitaxial layer in said vacuum chamber by molecular beam epitaxy with the aid of a K-cell inserted in said K-cell port.

2. A method as claimed in claim 1, wherein said permanent magnets are high field ceramic magnets.

3. A method as claimed in claim 2, wherein said permanent magnets are samarium cobalt magnets.

4. A method as claimed in claim 1, wherein said permanent magnets are located on a cathode body located within said cylindrical body.

5. A method as claimed in claim 3, wherein said permanent magnets are mounted on a backplate within said cathode body.

6. A method as claimed in claim 1, wherein said cooling ducts and magnets are removable.

7. A method as claimed in claim 1, wherein said first epitaxial layer is an aluminum based layer and said sputter target is aluminum.

8. A method as claimed in claim 7, wherein said first epitaxial layer is AlN.

9. A method as claimed in claim 8, wherein said second epitaxial layer is GaN.

10. A method as claimed in claim 1, wherein said magnets and cooling ducts are removable to permit bake-out of the MSE source.

11. A method as claimed in claim 10, wherein said protruding cylindrical body is attached to said flange via a ceramic insulator.

12. A method of growing epitaxial layers in a multilayered structure, comprising the steps of:
   a) providing a dual mode molecular beam epitaxy/ magnetic sputter epitaxy apparatus comprising
      (i) a vacuum chamber having a K-cell port for normally receiving a K-cell in an MBE (molecular beam epitaxy) mode, and
      (ii) a nitrogen source for supplying nitrogen to said chamber,
   b) growing an AlN buffer layer on a substrate in said vacuum chamber by magnetron sputter epitaxy using a removable MSE (magnetron sputter epitaxy) source assembly replacing said K-cell in said K-cell port and comprising
      (i) a protruding cylindrical body forming an anode shield and attached at its proximal end to a flange forming an ultra high vacuum seal and having its distal end open,
      (ii) an array of permanent magnets at the distal end of said cylindrical body,
      (iii) a magnet return piece mounted behind said permanent magnets,
      (iv) a sputter target mounted in front of said permanent magnets, said permanent magnets being configured that the magnetic field lines radiate through the target surface, and
      (v) cooling ducts within said cylindrical body for carrying a cooling medium to said sputter target, and
   c) growing a GaN epitaxial layer over said AlN buffer layer in said vacuum chamber by molecular beam epitaxy with the aid of a K-cell inserted in said K-cell port.

* * * * *